United States Patent
Takahashi (10) Patent No.: US 9,374,893 B2
(45) Date of Patent: *Jun. 21, 2016

(54) PRODUCTION METHOD OF METALLIZED SUBSTRATE

(75) Inventor: Naoto Takahashi, Yamaguchi (JP)

(73) Assignee: TOKUYAMA CORPORATION, Shunan-shi, Yamaguchi (JP)

(*) Notice: Subject to any disclaimer, the term of this patent is extended or adjusted under 35 U.S.C. 154(b) by 42 days.

This patent is subject to a terminal disclaimer.

(21) Appl. No.: 13/581,665

(22) PCT Filed: Feb. 28, 2011

(86) PCT No.: PCT/JP2011/054533
§ 371 (c)(1),
(2), (4) Date: Aug. 29, 2012

(87) PCT Pub. No.: WO2011/108498
PCT Pub. Date: Sep. 9, 2011

(65) Prior Publication Data
US 2012/0321805 A1 Dec. 20, 2012

(30) Foreign Application Priority Data
Mar. 2, 2010 (JP) .................. 2010-045283

(51) Int. Cl.
*B05D 3/00* (2006.01)
*H05K 1/09* (2006.01)
(Continued)

(52) U.S. Cl.
CPC ............ *H05K 1/092* (2013.01); *H01B 1/026* (2013.01); *H01B 1/22* (2013.01); *H05K 3/388* (2013.01); *H05K 1/0306* (2013.01); *H05K 3/12* (2013.01);
(Continued)

(58) Field of Classification Search
USPC ........................................ 427/383.5
See application file for complete search history.

(56) References Cited

U.S. PATENT DOCUMENTS 2,570,248 A * 10/1951 Kelley ............... 228/121
3,641,298 A * 2/1972 Broverman ........... 200/266
(Continued)

FOREIGN PATENT DOCUMENTS

EP 0 773 709 A2 5/1997
JP 62-197376 A 9/1987
(Continued)

OTHER PUBLICATIONS

International Search Report: mailed May 31, 2011; Appln. No. PCT/JP2011/054533.
(Continued)

*Primary Examiner* — Nathan Empie
(74) *Attorney, Agent, or Firm* — Ladas & Parry LLP (57) ABSTRACT

A production method for a metallized substrate to produce a metallized substrate which comprises: a sintered nitride ceramic substrate; a titanium nitride layer formed on the sintered substrate; and a metal layer containing copper, silver and titanium formed on the titanium nitride layer. The method comprises: a step of layering a first paste layer containing copper powder and titanium hydride powder on the sintered nitride ceramic substrate, to produce a first layered body; a step of layering a second paste layer containing silver-copper alloy powder on the first paste layer of the first layered body, to produce a second layered body; and a step of firing the second layered body, to thereby form the titanium nitride layer and the metal layer on the sintered nitride ceramic substrate.

18 Claims, 2 Drawing Sheets

(51) Int. Cl.
  *H01B 1/02* (2006.01)
  *H01B 1/22* (2006.01)
  *H05K 3/38* (2006.01)
  *H05K 1/03* (2006.01)
  *H05K 3/12* (2006.01)

(52) U.S. Cl.
  CPC  *H05K 2203/1131* (2013.01); *H05K 2203/1476* (2013.01)

(56) References Cited

U.S. PATENT DOCUMENTS

| | | | |
|---|---|---|---|
| 3,681,135 A | | 8/1972 | Cheary |
| 4,611,745 A | | 9/1986 | Nakahashi et al. |
| 4,729,504 A | * | 3/1988 | Edamura ............... 228/122.1 |
| 5,151,246 A | * | 9/1992 | Baumeister et al. ............ 419/2 |
| 5,354,415 A | * | 10/1994 | Fushii et al. .................. 216/13 |
| 5,561,321 A | | 10/1996 | Hirano et al. |
| 5,629,559 A | | 5/1997 | Miyahara |
| 5,955,686 A | * | 9/1999 | Sakuraba et al. ............ 75/235 |
| 2004/0262367 A1 | | 12/2004 | Nakamura |
| 2006/0063024 A1 | | 3/2006 | Natsuhara et al. |
| 2007/0164260 A1 | * | 7/2007 | Kuwajima ................... 252/512 |
| 2007/0228336 A1 | * | 10/2007 | Uchimi et al. ............... 252/500 |
| 2008/0020224 A1 | | 1/2008 | Yamamoto et al. |
| 2008/0131673 A1 | | 6/2008 | Yamamoto et al. |
| 2008/0131723 A1 | * | 6/2008 | Tucker et al. ................ 428/623 |
| 2008/0145518 A1 | | 6/2008 | Maeda et al. |

FOREIGN PATENT DOCUMENTS

| | | | | |
|---|---|---|---|---|
| JP | 03-101153 A | | | 4/1991 |
| JP | 4168792 A | | | 6/1992 |
| JP | 05-170552 A | | | 7/1993 |
| JP | 05-221759 A | | | 8/1993 |
| JP | 5226515 A | | | 9/1993 |
| JP | 06196831 A | * | | 7/1994 |
| JP | 6-342853 A | | | 12/1994 |
| JP | 06-349315 A | | | 12/1994 |
| JP | 7-14015 B2 | | | 2/1995 |
| JP | 7-126701 A | | | 5/1995 |
| JP | 07-207452 A | | | 8/1995 |
| JP | 07207452 A | * | | 8/1995 |
| JP | 10-188671 A | | | 7/1998 |
| JP | 2000281460 A | * | | 10/2000 |
| JP | 3729637 B2 | | | 12/2005 |
| JP | 2008-108957 A | | | 5/2008 |
| JP | 2009-176608 A | | | 8/2009 |
| TW | 200619016 | | | 6/2006 |
| TW | 200625989 | | | 7/2006 |
| TW | 200635083 | | | 10/2006 |
| WO | 2006/051881 A1 | | | 5/2006 |

OTHER PUBLICATIONS

USPTO RR dated Aug. 4, 2014 in connection with U.S. Appl. No. 13/258,185.

International Search Report dated Jun. 15, 2010; PCT/JP2010/055600.

USPTO NFOA dated Dec. 18, 2014 in connection with U.S. Appl. No. 13/258,185.

USPTO NOA mailed Dec. 7, 2015 in connection with U.S. Appl. No. 13/258,185.

USPTO FOA dated Aug. 11, 2015 in connection with U.S. Appl. No. 13/258,185.

* cited by examiner

PRODUCTION METHOD OF METALLIZED SUBSTRATE

TECHNICAL FIELD

The present invention relates to a production method of a metallized substrate for mounting a semiconductor device thereon.

BACKGROUND ART

The amount of heat per unit area generated by a semiconductor device to be mounted onto a wiring substrate has increased due to the micro-wiring and downsizing of the semiconductor device. It is therefore desired to form a wiring substrate by a material having higher thermal conductivity and a heat radiating capability. Conventionally, an alumina sintered body has been used as the material for the wiring substrate; however, because of the insufficient thermal conductivity of the alumina sintered body, the possibility of using an aluminum nitride sintered body, which has higher thermal conductivity, is being considered.

In order to produce a wiring substrate by using a sintered nitride ceramic substrate, a typical example of which is the aluminum nitride sintered body, it is necessary to form metal wiring on a surface of the nitride ceramic sintered body. Examples of the method for forming metal wiring include: a thick-film method in which a metal paste is applied and fired; and a thin-film method in which a metal thin film is formed by vapor deposition. Especially in the uses where the heat radiating capability is required, a large amount of electric current is often needed. As the thickness of the film formed by the thin-film method limits the amount of electric current permitted to flow, the thick-film method is favorably adopted. On the other hand, in the thick-film method, high-melting-point metal such as tungsten and molybdenum is often used to form metal wiring; and in this case, there is a problem that wiring resistance is increased.

The following are known as an industrial method for forming metal wiring by the thick-film method: a co-firing method and post-firing method in which a paste containing a high-melting-point metal powder is used. The co-firing method is a method in which to apply a high-melting-point metal paste onto a ceramic green sheet and fire them to thereby carry out sintering of the ceramic and firing of the high-melting-point metal concurrently. This co-firing method has characteristics that although it enables a solidly adhered metal layer to be formed, it is difficult to form a metal pattern with high dimensional precision due to the shrinkage of the ceramic following the sintering thereof. The post-firing method is a method in which to apply a high-melting-point metal paste onto a pre-sintered ceramic substrate and thereafter fire it. This method basically does not cause such a problem of dimensional precision as mentioned above. However, it has been difficult heretofore, by the post-firing method, to attain high bonding strength (adhesion strength) of the metal layer on the nitride ceramics. These days, there is being developed a post-firing method that enables formation of a high-melting-point metal layer adhered with high bonding strength even on the nitride ceramics (see Patent Document 1). However, there has not yet been established industrially a technique of forming a metal layer on a sintered nitride ceramic substrate by using different metal pastes that can lower the wiring resistance more.

With an aim to solve this problem, Patent Document 2 discloses an aluminum nitride substrate comprising a metallized layer formed by applying a paste containing a Ag—Cu alloy as the main component and titanium hydride as the secondary component, onto a sintered aluminum nitride substrate, and firing it.

In addition, Patent Document 3 discloses a metal powder composition for metallization for forming a metallized layer on a ceramic substrate, the metal powder composition comprising Cu powder and Ti powder as the main component and at least one selected from Ag, Al, and Zr as the secondary component, wherein the above main component accounts for 90 to 99.5% by weight %, and the above secondary component accounts for 0.5 to 10% by weight %; and discloses a production method of a metallized substrate using this metal powder composition for metallization.

CITATION LIST

Patent Documents

Patent Document 1: WO 2006/051881
Patent Document 2: Japanese Patent Application Laid-Open (JP-A) No. 5-226515
Patent Document 3: JP-A No. 7-207452

SUMMARY OF THE INVENTION

Problems to be Solved by the Invention

However, according to additional tests conducted by the inventors of the present invention, it was found that: in the metallized substrates of Patent Documents 2 and 3, the adhesion strength of the metallized layer formed by the thick-film method to the ceramic substrate sometimes degraded, and when plating was given to the surface of the metallized layer, the adhesion strength of the plating layer to the metallized layer sometimes degraded (hereinafter, this phenomenon may be expressed as "platability deteriorates".). Accordingly, an object of the present invention is to provide a production method of a metallized substrate by which the resistance value of a metallized layer is lowered to enable the electrical conductivity thereof to be favorable, and the adhesiveness of the metallized layer and the platability of the surface of the metallized layer can be favorable.

Means for Solving the Problems

The present invention will be described below. It should be noted that although the reference numerals shown in the accompanying drawings are quoted in parentheses to make the present invention easy to understand, the present invention is not limited to the embodiments shown in the drawings.

Figure 1:
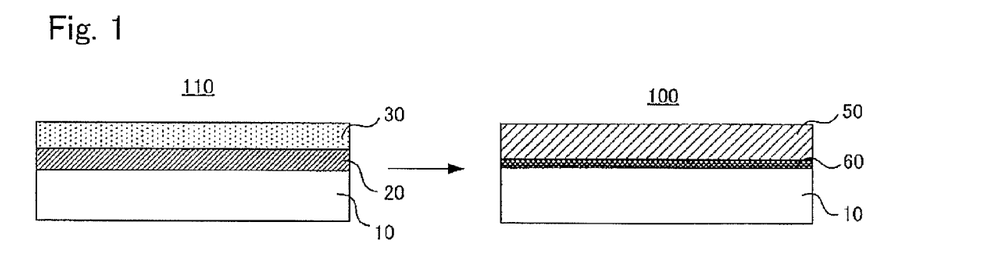
FIG. 1 is a conceptual view of the production method of a metallized substrate of the present invention.

A first aspect of the present invention is a production method of a metallized substrate (100) which comprises: a sintered nitride ceramic substrate (10); a titanium nitride layer (60) formed on the sintered substrate (10); and a metal layer (50) containing copper, silver, and titanium formed on the titanium nitride layer (60), the method comprising: a step of layering a first paste layer (20) containing copper powder and titanium hydride powder on the sintered nitride ceramic substrate (10), to produce a first layered body; a step of layering a second paste layer (30) containing "silver-copper alloy powder" (hereinafter, sometimes simply referred to as "alloy powder") on the first paste layer (20) of the first layered body, to produce a second layered body (110); and a step of firing the second layered body (110), to thereby form the titanium nitride layer (60) and the metal layer (50) on the sintered nitride ceramic substrate (10).

In the first aspect of the present invention, the first paste layer (20) may further contain silver powder and/or "silver-copper alloy powder". In this case, it preferably contains the silver powder and/or the silver-copper alloy powder in an amount of 1 part by mass or more and 80 parts by mass or less, with respect to 100 parts by mass of the copper powder.

In the first aspect of the present invention, the second paste layer (30) may further contain copper powder. In this case, it preferably contains the copper powder in an amount of 1 part by mass or more and 300 parts by mass or less, with respect to 100 parts by mass of the silver-copper alloy powder.

In the first aspect of the present invention, the content of the titanium hydride powder in the first paste layer (20) is preferably 1 part by mass or more and 10 parts by mass or less, based on the total mass of the copper component and silver component in the first paste layer (20) and second paste layer (30) together set as 100 parts by mass. It should be noted that the total of the copper component and silver component means a total of the silver powder, copper powder, and alloy powder contained in each paste composition.

In the first aspect of the present invention, the mass ratio between the silver component and the copper component in the first paste layer (20) and second paste layer (30) together is preferably 0.15 or more and 0.8 or less (silver component/copper component). It should be noted that the mass ratio between the silver component and the copper component means a mass ratio of the silver component and the copper component including the silver powder, copper powder, and alloy powder altogether that are contained in each paste composition.

A second aspect of the present invention is a production method of a metallized substrate (100) which comprises a sintered nitride ceramic substrate (10); a titanium nitride layer (60) formed on the sintered substrate (10); and a metal layer (50) containing copper, silver, and titanium formed on the titanium nitride layer (60), the method comprising: a step of layering a first paste layer (20) containing copper powder and titanium hydride powder on the sintered nitride ceramic substrate (10), to produce a first layered body; a step of layering a second paste layer (30) containing "silver-copper alloy powder" on the first paste layer (20) of the first layered body, to produce a layered body; a step of layering a third paste layer (40) containing copper powder between the first paste layer (20) and the second paste layer (30), or on the second paste layer (30), to produce a layered body; and a step of firing the layered body obtained through these steps, to thereby form the titanium nitride layer (60) and the metal layer (50) on the sintered nitride ceramic substrate (10).

In the second aspect of the present invention, the content of the titanium hydride powder in the first paste layer (20) is preferably 1 part by mass or more and 10 parts by mass or less, based on the total mass of the copper component and silver component in the first paste layer (20), second paste layer (30), and third paste layer (40) altogether set as 100 parts by mass.

In the first and second aspects of the present invention, the step of firing the layered body is preferably a step of firing the layered body in a heat-resistant container under the non-oxidizing atmosphere.

A third aspect of the present invention is a composition containing: 100 parts by mass of copper powder; 1 part by mass or more and 10 parts by mass or less of titanium hydride powder having an average particle size of 0.1 μm or more and 20 μm or less; and 1 part by mass or more and 10 parts by mass or less of a binder resin, wherein the copper powder is copper powder A having an average particle size of 0.1 μm or more and less than 1.0 μm, or a mixed powder containing the copper powder A in an amount of 30 parts by mass or more and less than 100 parts by mass and containing as a remainder copper powder B having an average particle size of 1.0 μm or more and 5.0 μm or less; and the thixotropic index of the composition is 0.2 or more and 1.0 or less.

In the third aspect of the present invention, the composition preferably contains as the binder resin, 0.2 parts by mass or more and 3.0 parts by mass or less of ethylcellulose resin, and 0.5 parts by mass or more and 8.0 parts by mass or less of an acrylic resin.

Effects of the Invention

According to the production method of the first aspect of the present invention, the metal layer (50) is composed mainly of a copper component and a silver component, therefore enabling the electrical conductivity of the metal layer (50) to be favorable. Further, titanium hydride powder is contained only in the first paste layer which contacts the sintered nitride ceramic substrate (10), and the second paste layer not containing the titanium component is formed on the first paste layer, therefore causing reaction (titanium-nitride-forming reaction) between the titanium component and the nitride ceramic of the sintered substrate to occur preferentially at the time of firing, and effectively inhibiting diffusion migration of the titanium component toward the surface of the metal layer (50). As a result, the titanium nitride layer (60) is formed between the metal layer (50) and the sintered body (10); and therefore not only the adhesiveness but also the platability of the metal layer (50) can be favorable. Moreover, in the present invention, the paste containing, as the metal component, "copper-silver alloy powder" that can serve as a so-called brazing material is layered as the second paste layer (30). This alloy powder, which has a melting point lower than that of silver and copper, melts and liquefies during firing, and permeates into the first paste layer (20). This enables formation of the metal layer (50) with the reduced number and size of voids or with no voids at all; therefore, the adhesiveness of the metal layer (50) can be favorable, and as a result the thermal conductivity of the resultant metallized substrate (100) can be better. Furthermore, the surface smoothness of the metal layer (50) can be enhanced.

According to the production method of the second aspect of the present invention, by further forming the third paste layer (40), it is possible to reduce unevenness on the surface of the metal layer (50) attributed to the lower layer and to enhance the surface smoothness thereof.

The composition of the third aspect of the present invention has a thixotropic property; thereby when the composition is screen-printed under common printing conditions (squeegee printing pressure and squeegee speed), it exhibits favorable fluidity when passing through the mesh of a screen printing plate, whereas having an adequately increased viscosity after passing through the mesh. Therefore, printing problems like bubbles, clogging of the plate, and bleeding can be inhibited. As such, by using the composition of the third aspect of the present invention in the production methods of the first and second aspects of the present invention, to form the first paste layer in a predetermined shape by the screen printing method, the shape of the opening portions (non-masking parts) of the screen printing plate can be reproduced more accurately, thus enabling formation of the metal layer (50) with enhanced shape precision. At this time, the operability (printability) does not degrade terribly. The mesh marks may remain on the surface of the first paste layer in this case; however, since the firing is carried out after layering the second paste layer, the remaining mesh marks are smoothed out, and as a result the metal layer (50) with enhanced surface smoothness can be formed.

Accordingly, with the production methods of the first and second aspects of the present invention and the composition of the third aspect of the present invention, a metallized substrate with a highly precise and highly fine wiring pattern can be easily and effectively produced. Further, the metal layer of the metallized substrate can be used as a marker as it has favorable visibility.

MODES FOR CARRYING OUT THE INVENTION

Production Method of a Metallized Substrate 100

As FIG. 1 shows an outline of the production method of a metallized substrate 100, a first paste layer 20 is formed on a sintered nitride ceramic substrate 10 first; and then a second paste layer 30 is formed on the first paste layer 20, thereby forming a second layered body 110. The second layered body 110 is fired, and a metallized substrate 100 comprising a titanium nitride layer 60 and a metal layer 50 on the sintered nitride ceramic substrate 10 is produced.

(Sintered Nitride Ceramic Substrate 10)

The sintered nitride ceramic substrate 10 can be produced by a known method in which to fire a nitride ceramic green sheet having a predetermined shape or a pressure-formed body obtained by pressure-forming nitride ceramic granules. The shape, the thickness and other properties thereof are not particularly restricted. The material of the sintered body may contain an ordinarily-used sintering aid, for example, a sintering aid including a rare-earth oxide. The surface of the sintered nitride ceramic substrate 10 may be polished as necessary to make it smooth. Examples of the nitride ceramics include: aluminum nitride, silicon nitride, boron nitride, zirconium nitride, titanium nitride, tantalum nitride, and niobium nitride. Among these, it is preferable to use aluminum nitride, which has high thermal conductivity and other properties.

(First Paste Layer 20 and Second Paste Layer 30)

In the production method of a metallized substrate 100 of the present invention, the first paste layer 20 containing copper powder and titanium hydride powder is layered on top of the sintered nitride ceramic substrate 10 first, thereby forming the first layered body. After that, the second paste layer 30 containing alloy powder is layered on top of the first paste layer 20 of the first layered body, thereby forming the second layered body 110. The first and second paste layers 20, 30 are formed by applying the below described paste compositions to an area where one desires to form a wiring pattern. The paste composition is preferably applied by printing in order to form precise wiring. Examples of the printing method include screen printing, ink-jet printing, and offset printing. The paste may be adequately adjusted to have the most suitable viscosity depending on the printing method to be adopted. However, in a case of adopting the screen printing method, considering the operability and pattern reproducibility, it is preferable to use a paste in which the amount of each component is adjusted such that the viscosity of the paste becomes 50 to 400 Pa·s at 25° C. The following may be carried out: the first paste layer 20 is formed and thereafter dried; and then the second paste layer 30 is formed and thereafter dried. Or, the first paste layer 20 and the second paste layer 30 may be formed and thereafter dried together. The drying method is not particularly restricted as long as it enables a solvent in the paste layer to be volatilized. An example may be drying for about one minute to one hour at a temperature of about 80° C. to 120° C.

In the production method of a metallized substrate 100 of the present invention, the first paste layer 20 containing titanium hydride powder and the second paste layer 30 not containing titanium hydride powder are layered and then fired, thereby forming the titanium nitride layer 60 and the metal layer 50. This titanium layer 60 is formed at an interface between the nitride ceramic sintered body 10 and the metal layer 50 by the reaction of the titanium component in the first paste layer 20 with the nitrogen component in the sintered nitride ceramic substrate 10.

Further, in the present invention, with the presence of the second paste layer 30 not containing titanium hydride powder, the titanium component can be inhibited from migrating to the surface of the metal layer 50; the platability of the surface of the metal layer 50 can be favorable; and crater-like roughness (hereinafter simply referred to as a "crater") on the surface of the metal layer 50 can be reduced. Additionally, by inhibiting the titanium component from moving to the surface of the metal layer 50, the titanium nitride layer 60 can be formed well at the interface between the sintered nitride ceramic substrate 10 and the metal layer 50, and the adhesiveness of the metal layer 50 becomes more favorable.

When firing was performed without forming the second paste layer after forming the first paste layer, the copper cannot be sintered enough, causing voids to remain in the metal layer produced in some cases. The voids in the metal layer not only cause deterioration of the adhesiveness and thermal conductivity of the metal layer, but also cause degradation of the surface smoothness of the metal layer. For example, even if a metal layer with a seemingly smooth surface can be obtained, the voids will appear on the surface when the metal layer is polished, and therefore highly smooth surface cannot be obtained. Further, when the voids range up to the surface of the metal layer, crators will be created on the surface of the metal layer, which will cause tarnish and/or blister when plating is performed on the surface of the metal layer.

The voids are thought to be formed by the following mechanism. In the firing step, titanium hydride powder releases hydrogen to produce titanium. Titanium thus produced not only forms a titanium nitride layer through the reaction with a nitride ceramic; but also some of the titanium produced reacts with copper powder to form a Cu—Ti compound phase on the surface of the copper particles. It is assumed that formation of this Cu—Ti phase inhibits sintering of the copper particles (powder), causing the voids to be formed. Accordingly, it can be seen that formation of the voids can be inhibited by facilitating sintering of the copper powder. A method for facilitating sintering of the copper powder may be containing silver powder or "silver-copper alloy powder" having a low melting point in the metal paste layer, to facilitate the sintering by the liquid phase formed as a result of the melting of the powder. However, if this method is used, the content of the copper powder will decrease relatively, and therefore it may be difficult to maintain the shape of the metal layer due to the flowing of the liquid phase thus generated. Consequently, there may be caused deformation of the pattern or a large depression on the surface of the metal layer.

By contrast, in the present invention, the second paste layer 30 containing "silver-copper alloy powder" (alloy powder) is formed on the first paste layer; therefore such problems as described above do not arise. In specific, since a relative proportion of the copper powder in the first paste layer is high, the shape of the first paste layer can be maintained even at the time of firing. Therefore, even if the alloy powder in the second paste layer 30 melts to form a liquid phase and permeates into the first paste layer 20, the liquid phase is held in between the copper particles, and therefore is inhibited from flowing out of the first paste layer 20. As such, the effect of facilitating sintering of the copper particles (powder) by the liquid phase can be enhanced. In addition, even if voids are formed in the first paste layer, the liquid phase serves to fill the voids. Therefore, it is possible to effectively prevent void formation and pattern deformation in the metal layer 50.

Figure 3A:
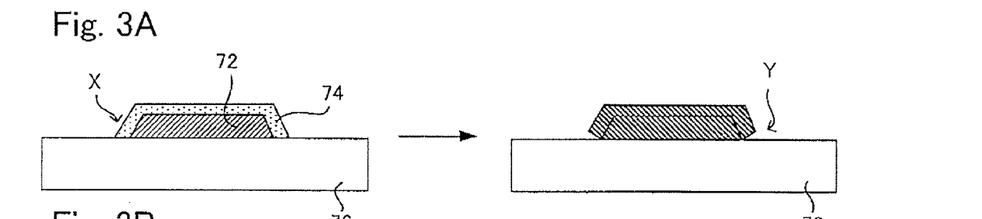
FIG. 3A is a conceptual view illustrating a problem that an end portion of a metallized pattern formed by firing is caused to rise when metal powder that is not an alloy powder is used for an upper paste layer.
Figure 3B:
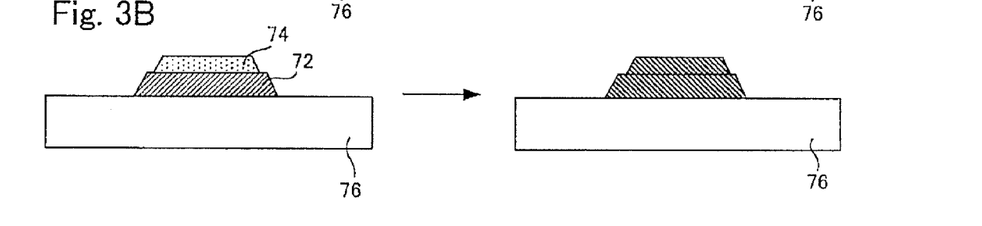
FIG. 3B is a conceptual view illustrating a problem that the effective utilization area of a metallized pattern formed by firing decreases when metal powder that is not an alloy powder is used for an upper paste layer.

Further, when silver powder and copper powder are used instead of the alloy powder contained in the second paste layer and are brought into reaction at the time of firing to form a liquid phase, the speed of generating the liquid phase will be slow and it will be difficult to generate a sufficient amount of liquid phase. In order to increase the amount of liquid phase, the film thickness of the paste layer (upper paste layer) to be formed on the first paste layer needs to be made larger than the thickness needed in the present invention, thus causing degradation of the efficiency including economic efficiency. Further, in a case of using an ordinary metal powder such as copper powder and silver powder in the upper paste layer, if a layer is formed by screen printing using the same screen printing plate in such a manner as layering the lower paste layer 72 containing copper powder and titanium hydride powder and the upper paste layer 74 containing copper powder and silver powder as shown in FIG. 3A, the upper paste layer 74 can be easily forced out (X) of the edge of the paste layer. If the substrate is fired in a state that the upper paste layer is forced out like this, the titanium nitride layer will not be formed on the end portion of the metal layer where the upper layer not containing the titanium component contacts the substrate. As a result, the upper layer is caused to rise (Y) because it does not bond with the substrate. Consequently, in performing plating on the metal layer after the firing, the plating can easily overflow and tarnish. In order to solve this problem, the size of the upper paste layer 74 may be reduced, as shown in FIG. 3B, thereby preventing the upper paste layer 74 from contacting the sintered body 76. However, in this case although the end portion of the metallized pattern formed is not caused to rise, there arises a problem that the area of the metallized pattern that can be effectively utilized is reduced.

By contrast, in the method of the present invention, the alloy powder is contained as the main component for the metal component of the upper layer (second paste layer 30); therefore the metal component in the second paste layer 30 as the upper layer substantially melts completely at the time of firing, and is absorbed to the first paste layer 20 to become unified. Accordingly, the above problem of the rising of the end portion does not occur. Further, this unification of the second paste layer with the first paste layer enables the voids in the first paste layer to be filled. Further, even when the second paste layer 30 is formed smaller than the first paste layer 20 as shown in FIG. 3S in order to strictly prevent the second paste layer 30 from being forced out, the second paste layer 30 eventually melts and is absorbed into the first paste layer 20 to become unified; therefore, unevenness does not occur in the metal layer 50 formed, and the effective utilization area thereof does not decrease.

The thickness of the first paste layer 20 is preferably 3 μm or more and 150 μm or less, and more preferably 5 μm or more and 70 μm or less. The thickness of the second paste layer 30 is preferably 3 μm or more and 150 μm or less, and more preferably 5 μm or more and 70 μm or less. The thickness ratio between the first paste layer 20 and the second paste layer 30 (first paste layer/second paste layer) is preferably 0.1 or more and 10.0 or less, and more preferably 0.2 or more and 5.0 or less.

It should be noted that in the present invention the thickness of the first paste layer refers to a thickness of the paste layer obtained after applying the below described first paste composition onto the sintered nitride ceramic substrate, drying it, and thereby volatilizing a solvent in the paste layer. In addition, the thickness of the second paste layer also refers to a thickness of the paste layer obtained after applying the below described second paste composition onto the first paste layer, drying it, and thereby volatilizing a solvent in the paste layer.

(First and Second Paste Compositions)

The first paste composition for forming the first paste layer 20 contains copper powder and titanium hydride powder as the metal component (although titanium hydride itself is not metal, it is treated as a metal component for the reason that it becomes titanium by decomposing at the time of firing). In addition to these, the first paste composition preferably contains a binder, a dispersing agent and a solvent as an organic component. The second paste composition for forming the second paste layer 30 contains "silver-copper alloy powder" as the metal component. In addition to these, the second paste composition likewise preferably contains a binder, a dispersing agent and a solvent as an organic component.

Herein, as to the organic component, those that are used in an ordinary metal paste (metallizing paste) employed in the thick-film method may be used without particular restrictions. The amount of use thereof is also adequately determined in consideration of the printability, degreasing capability and the like.

Examples of the binder include: acrylic resins such as polyacrylic acid ester, and polymethacrylic acid ester; cellulose resins such as methylcellulose, hydroxymethylcellulose, ethylcellulose, nitrocellulose and cellulose acetate butyrate; and vinyl-group-containing resins such as polyvinyl butyral, polyvinyl alcohol, and polyvinyl acetate. In addition, in order to improve the printability and the like, two or more resins may be used in a mixture form. Among these, acrylic resins are especially preferred in that they produce few residues (have a favorable degreasing capability) at a time of performing firing in an inert atmosphere; and ethylcellulose is preferred in that it has a high thixotropic property and excellent printability. As described below, by using an acrylic resin and ethylcellulose in a mixture form at a certain mixing ratio, it is possible to attain excellent printability and a favorable degreasing capability. For this reason, an acrylic resin and ethylcellulose in a mixture form are most preferably employed as the binder to be used in the first paste composition. On the other hand, acrylic resins are most preferably employed as the binder to be used in the second paste layer.

Further, examples of the solvent include toluene, ethyl acetate, terpineol, butyl carbitolacetate, and texanol.

Additionally, a surfactant, plasticizer and the like may be added as an additive to improve the printability, storage stability and the like. Examples of the dispersing agent that can be favorably used may include phosphate ester type ones and polycarboxylic acid type ones.

As mentioned above, as an industrial method for forming metal wiring by the thick-film method, the co-firing method and post-firing method are known in which a paste containing a high-melting-point metal powder is used. The same kind of ceramic powder as used in a substrate is generally added to the high-melting-point metal paste employed in these methods, in order to improve the adhesiveness of the metal paste to the ceramic substrate or to adjust the thermal expansion coefficient. However, as ceramics are insulating components, they cause a problem of degrading the electrical conductivity of the metal layer. On the other hand, it is unnecessary to add ceramic powder, which is an insulating component, to each of the metal paste compositions used in the present invention. Therefore, the electrical conductivity of the metal layer 50 formed can be even better.

The first paste composition contains copper powder and titanium hydride powder as the metal component, as described above. The content ratio between the copper powder and the titanium hydride powder in the first paste composition is as follows: 1.0 part by mass or more and 20.0 parts by mass or less, preferably 2.0 parts by mass or more and 15.0 parts by mass or less of the titanium hydride powder, with respect to 100 parts by mass of the copper powder.

The first paste composition may contain silver powder and/or "silver-copper alloy powder" (alloy powder) as the metal component, in addition to copper powder and titanium hydride powder. By adding these metal powders to the first paste composition, it is possible to more surely prevent generation of voids in the metal layer 50 obtained after the firing, and also to lower the resistance value of the metal layer 50 more. On the other hand, if the content of the silver powder and/or alloy powder is excessively large, material costs will increase and the quantity of liquid phase will increase excessively in the metal layer, thus making it unable to maintain its shape and likely causing difficulty in forming a precise wiring pattern. Therefore, the content of the silver powder and/or alloy powder in the first paste composition, to 100 parts by mass of the copper powder, is preferably 1 part by mass or more and 80 parts by mass or less.

The average particle size of the copper powder to be contained in the first paste composition is not particularly restricted; copper powder having a particle size similar to that of the copper powder employed in a conventional paste may be used. For example, copper powder having an average particle size of 0.1 μm or more and 5.0 μm or less may be used. At this time, copper power having a particle size distribution with only one peak, for example a normal distribution, may be employed; or copper power having a particle size distribution with a plurality of peaks, for example copper powder having a plural kinds of copper powder with different average particle sizes mixed may be employed. In a case of using a mixed powder in which copper powder with different average particle sizes are mixed, preferably used is a mixed powder of: copper powder (copper powder B) having an average particle size of preferably 1.0 μm or more and 5.0 μm or less, and more preferably 1.5 μm or more and 3.0 μm or less; and copper powder (copper powder A) having an average particle size of preferably 0.1 μm or more and less than 1.0 μm, and more preferably 0.2 μm or more and 0.6 μm or less.

It should be noted that the average particle size herein, including an average particle size of other powders described below means a value (volume average value) measured by laser diffractometry using Microtrac manufactured by Nikkiso Co., Ltd.

Further, the average particle size of the titanium hydride powder to be contained in the first paste composition is not particularly restricted; titanium hydride powder having a particle size similar to that of the titanium hydride powder used in a conventional paste may be employed. In specific, titanium hydride powder having an average particle size of 0.1 μm or more and 20.0 μm or less, especially titanium hydride powder having an average particle size of 0.5 μm or more and 10.0 μm or less may be employed. Industrially available titanium hydride powder generally has a wide particle size distribution, and sometimes partially contains coarse particles even if it has an average particle size within the above range. When the coarse particles of the titanium hydride powder are present in the paste composition, smoothness of the surface of the metal layer may deteriorate as will be described below. Therefore, it is preferable that the titanium hydride powder to be contained in the first paste composition preferably have a particle size distribution which preferably does not contain particles of over 30 μm, and more preferably does not contain particles of over 20 μm. That is, the upper limit of the particle size of the titanium hydride powder in a strict sense is preferably 30 μm or less and more preferably 20 μm or less.

It should be noted that the above particle size distribution means a particle size distribution measured by laser diffractometry using Microtrac manufactured by Nikkiso Co., Ltd.

Further, an average particle size of the silver powder is also not particularly restricted; silver powder having a particle size similar to that of the silver powder used in a conventional paste may be employed. In specific, silver powder having an average particle size of 0.1 μm or more and 5.0 μm or less, especially silver powder having an average particle size of 0.5 μm or more and 4.0 μm or less may be favorably used.

Additionally, the average particle size of the "silver-copper alloy powder" (alloy powder) is also not particularly restricted; alloy powder having a particle size similar to that of the alloy powder used in a conventional paste may be employed. In specific, alloy powder having an average particle size of 0.1 μm or more and 20 μm or less, especially alloy powder having an average particle size of 0.5 μm or more and 10 μm or less may be favorably used.

By using metal component particles that satisfy the above range, the printability of screen printing improves, and therefore the pattern (metal layer 50) can be inhibited from being forced out. Furthermore, a denser metal layer 50 can be formed. With the densely formed metal layer 50, when forming a plating layer on the metal layer 50, it is possible to prevent problems such as tarnishing of the metallized layer and swelling of the plating film that occurs at the time of heating, which problems are caused by a plating liquid permeating into the metal layer 50 and remaining in the metallized layer.

In order to be able to easily and effectively produce a metallized substrate having a highly precise and highly fine wiring pattern or a metallized substrate having a metal layer that serves as a marker with favorable visibility, the thixotropic index of the first paste composition is preferably 0.2 or more and 1.0 or less, and especially preferably 0.3 or more and 0.8 or less. Herein, the thixotropic index (TI) is a value determined by the slope of the viscosity changes (represented by the common logarithm) against the changes in the shear rate in a viscosity-shear rate curve at 25° C., which is formed by the spiral-type viscosity measurement in accordance with the method of JIS 23284 Annex 6. In specific, it is calculated based on the below formula:

$$TI = \log(\eta 1/\eta 2)/\log(D2/D1) \quad (1)$$

η1: viscosity at a time when the shear rate is D1
η2: viscosity at a time when the shear rate is D2
D1: 1.8 s$^{-1}$ (3 rpm)
D2: 18 s$^{-1}$ (30 rpm)

With the thixotropic index of the first paste composition at 0.2 or more, the fluidity of the paste during rest can be reduced. Therefore, bleeding at the time of forming the first paste layer by screen printing can be easily inhibited. Further, with the thixotropic index of the first paste composition at 1.0 or less, the leveling effect at the time of screen printing improves. Therefore, the mesh marks that remain on the surface of the first paste layer after the screen printing can be reduced. As such, since smoothing out the mesh marks by layering the second paste layer and carrying out the firing thereof can be done even more easily, the surface smoothness of the metal layer (50) can be even better.

In general, when acrylic resins are used as a binder, it is difficult to enhance the thixotropic property of a paste. However, in the present invention, by adding to the first paste composition a certain amount or more of copper powder (copper powder A) having an average particle size of 0.1 µm or more and less than 1.0 µm, it is possible to enhance the thixotropic property to a favorable level. Further, also by adding acrylic resins and ethylcellulose resin as the binder in a certain range, it is possible to further improve the thixotropic property. Additionally, by adjusting the content of the copper powder and the binder, the first paste composition can have a thixotropic index in the above favorable range.

Specifically, in order for the first paste composition to have a thixotropic index of 0.2 or more and 1.0 or less, the following may be done: (1) setting the content ratio between the copper powder and the titanium hydride powder such that the content of the titanium hydride powder, to 100 parts by mass of the copper powder, is 1 part by mass or more and 10 parts by mass or less, preferably 2.5 parts by mass or more and 8.5 parts by mass or less; (2) using as the copper powder, only copper powder A having an average particle size of 0.1 µm or more and less than 1.0 µm, or a mixed powder of the copper powder A and copper powder B having an average particle size of 1.0 µm or more and 5.0 µm or less, in which mixed powder the content of the copper powder A in 100 parts by mass of the mixed powder is 30 parts by mass or more and less than 100 parts by mass; (3) using as the titanium hydride powder, titanium hydride powder having an average particle size of 0.1 µm or more and 20 µm or less; and (4) containing a binder resin in an amount of 1 part by mass or more and 10 parts by mass or less, with respect to 100 parts by mass of copper powder. At this point, as the binder resin, ethylcellulose resin and an acrylic resin are preferably contained in an amount of 0.2 parts by mass or more and 3.0 parts by mass or less, and in an amount of 0.5 parts by mass or more and 8.0 parts by mass or less, respectively, based on 100 parts by mass of the copper powder. A more preferred example of the first paste composition may be a composition containing: 100 parts by mass of copper powder which is a mixed powder of copper powder A' having an average particle size of 0.2 µm or more and 0.6 µm or less and copper powder B' having an average particle size of 1 µm or more and 3 µm or less, wherein the content of the copper powder A' in 100 parts by mass of the mixed powder is 35 parts by mass or more and 60 parts by mass or less and the remainder is the copper powder B'; 3.0 parts by mass or more and 8.0 parts by mass or less of titanium hydride having an average particle size of 0.5 µm or more and 10 µm or less; and 0.3 parts by mass or more and 2.0 parts by mass or less of ethylcellulose and 1.0 part by mass or more and 6.0 parts by mass or less of acrylic resin, wherein the thixotropic index of the composition is 0.3 or more and 0.8 or less. As for the ethylcellulose resin, it is preferable to use ethylcellulose resin wherein the viscosity at 25° C. of the solution formed by dissolving ethylcellulose in a mixed solvent of toluene/ethanol (a mixing mass ratio: 8/2) in a way that ethylcellulose accounts for 5 mass %, is 4 cps or more and 20 cps or less. Further, the acrylic resin includes methacrylic resins. As for the acrylic resin, it is preferable to use an acrylic resin wherein the viscosity at 25° C. of the 10 mass % solution formed on dissolution in terpineol, is 100 cps or more and 1000 cps or less. It is especially preferable to use polyalkylmethacrylate resin wherein the viscosity at 25° C. of the above solution is 150 cps or more and 800 cps or less. Further, the ethylcellulose resin and the acrylic resin are preferably contained such that the content mass ratio thereof is 0.06 or more and 2.0 or less (mass of ethylcellulose resin/mass of acrylic resin). In addition, these compositions preferably contain a solvent, and preferably further contain a dispersing agent.

The second paste composition contains "silver-copper alloy powder" as the metal component. In the present invention, the "silver-copper alloy powder" refers to a solid solution containing silver and copper, or an eutectic or intermetallic compound containing silver and copper. The "silver-copper alloy powder" refers to a powder which has particles of the above alloy as the particles to constitute the powder. The "silver-copper alloy powder" may contain metal other than silver and copper, for example metal such as zinc, tin, and cadmium that are contained in a silver brazing material. However, in order to be able to enhance the electrical conductivity of the metal layer 50 obtained after the firing, a silver-copper alloy made of silver, copper, and incidental impurities is preferred, and a silver-copper alloy made of silver and copper is especially preferred. Further, the melting point thereof is preferably higher than the decomposition temperature of the binder contained in the paste, and lower than the melting point (1083° C.) of copper, especially lower than the melting point (962° C.) of silver; and more preferably 630° C. to 850° C. An example of such a silver-copper alloy may be one in which the content rate of the copper component is 20 mass % to 35 mass %. Among these, in order to be able to easily attain the effects of the present invention, which are to reduce voids in the metal layer and to enhance the adhesiveness, thermal conductivity, and surface smoothness of the metal layer, and also in view that it has favorable operability and is easily available, an eutectic composition of Ag—Cu, that is, silver-copper alloy in which the content rate of the copper component is 28 mass %, is preferred.

The second paste composition especially preferably contains only an alloy powder as the metal component. With this configuration of the second paste composition, the second paste composition melts at the time of firing and is absorbed into the first paste layer 20. Therefore, the above problems do not occur that the end portion of the paste layer gets forced out and the end portion of the metal layer is caused to rise (see FIG. 3A).

The second paste composition may contain copper powder as the metal component in addition to the alloy powder. By containing copper powder in the second paste composition, it is possible to make the surface of the metal layer 50 smoother. However, if the amount of the copper powder contained therein is excessively large, the amount of the alloy decreases relatively, and therefore the effect of preventing generation of voids becomes insufficient, likely causing voids to be formed in the metal layer 50. Therefore, the content of the copper powder, to 100 parts by mass of the alloy powder, is preferably 1 part by mass or more and 300 parts by mass or less, and especially preferably 10 parts by mass or more and 200 parts by mass or less.

Even when copper powder is contained in the second paste layer 30, the above mentioned problems that the end portion of the paste layer gets forced out and the end portion of the metal layer is caused to rise (see FIG. 3A) can be alleviated by containing the alloy powder. In particular, by setting the content of the copper powder within the above especially preferable range, the effect of alleviating the problems can be further realized.

Each of the metal powders to be contained in the second paste composition as the metal component is the same as in the first paste composition.

The content rate of the metal powder in each of the first paste composition and second paste composition is as indicated above. However, when actually forming the first paste layer 20 and the second paste layer 30, in view of the adhesiveness of the metal layer 50 to the substrate, electrical conductivity of the metal layer 50, and prevention of the liquid phase from flowing out at the time of firing, the content rate of the metal powder in each of the first paste composition and second paste composition is preferably controlled based on the combination of these compositions and the thickness of each layer, such that the content rate of the metal component in the entire paste layer becomes a predetermined rate. That is, in the entire paste layer constituted by the layered body of the first paste layer 20 and the second paste layer 30, the content of the titanium hydride powder is preferably controlled to be 1 part by mass or more and 10 parts by mass or less, based on the total amount, as 100 parts by mass, of the copper component and silver component in the entire layered body. Herein, the total amount of the copper component and silver component means a total of the silver powder, copper powder, and alloy powder contained in each paste composition. The reason why the total amount of the copper component and silver component contained in the above entire paste layer is used as a reference is because if the second paste layer 30 can be formed thickly, the content of the titanium hydride powder in the first paste layer 20 can be increased.

In view of the costs, electrical conductivity of the metal layer 50, and prevention of the liquid phase from flowing out at the time of firing, the mass ratio between the silver component and the copper component in the entire paste layer is preferably 0.15 or more and 0.8 or less (silver component/copper component). Increasing the content of the silver component within the above range can produce the advantageous effects of further reducing voids in the metal layer 50 and further decreasing the resistance value of the metal layer 50.

(Third Paste Layer 40)

Figure 2A:
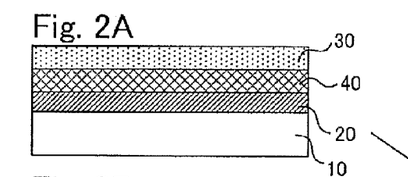
FIG. 2 is a conceptual view of the production method of a metallized substrate (a case of forming the third paste layer) of the present invention.
Figure 2B:
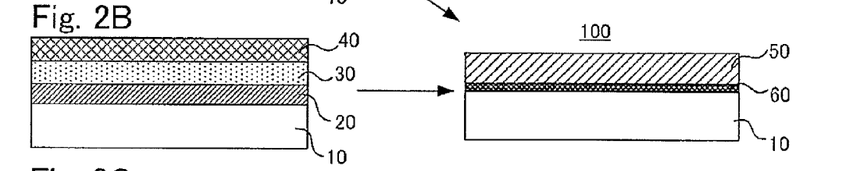
Figure 2C:
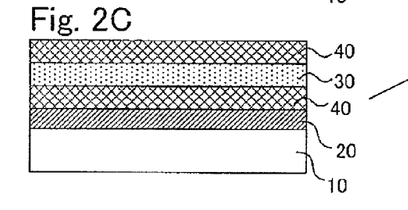

As shown in FIGS. 2A and 2B, the production method of a metallized substrate 100 of the present invention may comprise a step of layering the third paste layer 40 containing copper powder between the first paste layer 20 and the second paste layer 30 (FIG. 2A), or on the second paste layer 30 (FIG. 2B). In a case of forming the third paste layer 40 in this manner, there are two configurations of the layered body before fired: "sintered nitride ceramic substrate 10/first paste layer 20/third paste layer 40/second paste layer 30" as in FIG. 2A; and "sintered nitride ceramic substrate 10/first paste layer 20/second paste layer 30/third paste layer 40" as in FIG. 2B. A method of forming the third paste layer 40 (application of a paste composition, viscosity of a paste etc.) is similar to the case of the above first paste layer 20. As shown in FIG. 2C, the third paste layer 40 may be formed both in between the first paste layer 20 and the second paste layer 30, and on the second paste layer 30.

In a case of forming the metallized substrate 100 by firing the layered body constituted by the sintered substrate 10/first paste layer 20/second paste layer 30, if the particle size of the titanium nitride powder contained in the first paste layer 20 is large, the surface of the metal layer formed may become rough. For example, in a case of using titanium nitride powder containing coarse particles of over 30 μm, which is the upper limit of the above mentioned favorable range of the particle size distribution of the titanium hydride powder, the surface becomes rough, and problems may occur in mounting a device. In such a case, it is effective to form the third paste layer 40. Whether formed between the first paste layer 20 and the second paste layer 30, or on the second paste layer 30, the third paste layer 40 is formed on the first paste layer 20 containing titanium hydride powder. With the presence of this third paste layer 40 containing copper powder, the surface roughness which results from the titanium hydride powder in the first paste layer can be reduced.

In view of more effectively smoothing the surface of the metal layer, and of not degrading but maintaining the effect of inhibiting generation of voids in the metal layer, the thickness of the third paste layer is preferably 1 μm or more and 100 μm or less, more preferably 5 μm or more and 50 μm or less, and still more preferably 8 μm or more and 30 μm or less.

Further, the thickness ratio of the third paste layer 40 to the first paste layer 20 is preferably 0.1 or more and 10.0 or less, and more preferably 0.2 or more and 5.0 or less (third paste layer/first paste layer).

It should be noted that in the present invention, the thickness of the third paste layer 40 refers to a thickness of the paste layer obtained after applying the below described third paste composition onto the underlying paste layer, drying it, and thereby volatilizing a solvent in the paste layer.

The third paste composition to form the third paste layer 40 contains copper powder. In addition, it preferably contains a binder, a dispersing agent, and a solvent as an organic component. As for the organic component herein, the organic components used in an ordinary metal paste (metallizing paste) employed in the thick-film method and the organic components given as an example in the first paste composition may be employed without particular restrictions. The amount of use thereof may be adequately determined in consideration of the printability, degreasing property and the like. As for the binder, acrylic resins are preferred in that they produce few residues at a time of carrying out firing in an inert atmosphere.

The third paste composition may contain silver powder and/or alloy powder in addition to copper powder. However, in order to give smoothness to the surface of the metal layer, the content rate of the copper powder is preferably 70 mass % or more and 100 mass % or less, based on the total mass (100 mass %) of the metal component (metal powder) contained in the third paste composition.

The average particle size of the copper powder contained in the third paste composition is not particularly restricted; copper powder having a particle size similar to that of the copper powder used in a conventional paste may be used. For example, copper powder having an average particle size of 0.1 μm or more and 5.0 μm or less may be favorably employed.

Further, in a case of forming the third paste layer 40, the amount of the titanium hydride powder contained in the first paste layer 20 is preferably 1 part by mass or more and 10 parts by mass or less, based on the total mass, as 100 parts by mass, of the copper component and silver component in the entire paste layer including the first paste layer 20, second paste layer 30, and third paste layer 40 altogether. The particle size of the metal particles in the third paste layer 40 is the same as the case of the first paste layer 20 in which the above mentioned thixotropic index is not particular restricted. Additionally, the mass ratio of the silver component to the copper component in the whole of the first paste layer 20, second paste layer 30, and third paste layer 40 altogether, is preferably 0.15 or more and 0.8 or less (silver component/copper component).

(Firing Step)

In the firing step, the layered body 110 produced above, more specifically, the layered body 110 comprising the sintered nitride ceramic substrate 10, first paste layer 20, and second paste layer 30 is fired. Thereby, the titanium nitride layer 60 and the metal layer 50 are formed on the sintered nitride ceramic substrate 10. The firing conditions of the layered body having the third paste layer 40 formed are basically the same. Therefore, firing of the layered body 110 will be described below (the below descriptions may be directly applied to the layered body with the third paste layer 40).

In the present invention, the layered body 110 is preferably fired in a heat-resistant container under the non-oxidizing atmosphere.

The non-oxidizing atmosphere may be a vacuum atmosphere, an atmosphere of an inert gas such as argon gas and helium gas, or a hydrogen gas atmosphere. Further, it may be a mixed atmosphere of an inert gas and hydrogen gas. Of these non-oxidizing atmospheres, a vacuum atmosphere or an atmosphere of a mixed gas of an inert gas and hydrogen gas is preferably adopted. When performing the firing in a vacuum atmosphere, the vacuum degree is preferably as high as possible in order to prevent a reactive gas such as oxygen and nitrogen in the atmosphere from reacting with titanium. The vacuum degree is preferably $1.33 \times 10^{-1}$ Pa or less, and more preferably $1.33 \times 10^{-2}$ Pa or less. The upper limit of the vacuum degree is not particularly restricted; however, in consideration of industrial production, it is $1.33 \times 10^{-4}$ Pa or more.

The heat-resistant container may be any as long as it is formed of a material that can surely endure the temperature at which the layered body 110 is fired; and it preferably does not permit gas transmission, does not generate gas from the container itself, and is highly airtight, even under high temperatures at the time of firing. Specific examples of the material that can be favorably employed for this heat-resistant container include: a sintered body of a nitride such as aluminum nitride, boron nitride, and silicon nitride; a sintered body of an oxide such as alumina, magnesia, and zirconia; and heat-resistant alloys such as Incoloy and Hastelloy; and quartz glass. Among these, a nitride sintered body, which has excellent thermal conductivity, is preferred in view of ensuring heat evenness in the container at the time of firing.

The heat-resistant container is thought to fulfill a role of blocking the atmosphere near the layered body 110 in the firing step from the other atmosphere inside the firing furnace, and inhibiting a decomposition material and other pollution sources formed as a result of the binder in the paste decomposing and scattering to re-adhere to the furnace wall etc., from re-scattering with the temperature increase inside the firing furnace and reacting with the titanium component in the first paste layer 20. Therefore, this heat-resistant container is preferably configured such that it can be closed with a lid so as to block the atmosphere near the layered body 110 in the firing step from the other atmosphere inside the firing furnace. Further, the heat-resistant container may be a container that can be sealed up completely; but it may also be a container that has an opening to a degree that allows a gas generated by thermal decomposition of the binder in the first paste layer 20, second paste layer 30, and third paste layer 40, to be released to the outside of the container.

Further, the shape of the heat-resistant container is preferably in a size that does not cause, in the firing furnace, a distribution of the temperature inside the heat-resistant container. From this point of view as well, the heat-resistant container is preferably a container made of a nitride sintered body, which has excellent thermal conductivity.

In the present invention, with the presence of the second paste layer 30 not containing titanium hydride powder (and the third paste layer 40 in some cases), the titanium in the first paste layer 20 can be prevented from migrating to the surface of the metal layer 50. Herein, by firing the layered body 110 in the heat-resistant container under the non-oxidizing atmosphere, the titanium in the first paste layer 20 can be prevented more effectively from migrating to the surface of the metal layer 50. This enables the following effects of the present invention to be notably exerted: when the layered body 110 is fired in the heat-resistant container under the non-oxidizing atmosphere, the below described titanium nitride layer 60 is formed well; the adhesiveness of the metal layer 50 becomes favorable; the titanium concentration on the surface of the metal layer 50 is reduced; the platability on the surface of the metal layer 50 becomes favorable; and the craters on the surface of the metal layer 50 are reduced.

The firing may be performed at a temperature of the melting point (1083° C.) of copper or less. However, in order to form a fine wiring pattern with high precision, the firing is preferably performed at a temperature of 800° C. or more and 950° C. or less. If the firing temperature is raised within the above firing temperature range, an advantageous effect of decreasing voids in the metal layer 50 can be attained. Further, the firing time may be adequately determined depending on the wiring pattern, film thickness and other factors; usually, firing can be done without a problem by keeping several seconds or more and one hour or less within the above temperature range.

(Titanium Nitride Layer 60)

The titanium nitride layer 60 is formed at the interface between the sintered nitride ceramic substrate 10 and the metal layer 50 by the reaction of the titanium component in the first paste layer 20 with the nitrogen component in the sintered nitride ceramic substrate 10. It is confirmed that the reaction of titanium and the nitride ceramic sintered body progresses at a very high speed and the wettability of the reaction product to the substrate is favorable. Therefore, it is seen that with the titanium nitride layer formed, strong adhesiveness of the metal layer 50 can be attained.

The titanium nitride layer 60 may contain copper, silver, ceramic components and the like, in addition to titanium nitride. It contains titanium nitride in an amount of 50 mass % or more, preferably 70 mass % or more, based on the mass (100 mass %) of the entire titanium nitride layer. The thickness of the titanium nitride layer 60 is not particularly restricted. However, in order to attain favorable adhesiveness of the metallized layer, the lower limit is preferably 0.05 µm or more, preferably 0.10 µm or more, and more preferably 0.20 µm or more. The upper limit is not particularly restricted. However, in terms of the actual production, it is usually 3.0 µm or less, preferably 2.0 µm or less. The thickness of this titanium nitride layer 60 can be identified through observation of the cross section of the metallized substrate 100 by an electron microscope.

(Metal Layer 50)

The metal layer 50 is formed on the titanium nitride layer 60 by: layering the first paste layer 20 on the sintered nitride ceramic substrate 10; further layering the second paste layer 30 (and the third paste layer 40 in some cases) on the first paste layer 20; and firing the resultant second layered body 110.

The metal layer 50 desirably contains silver in an amount of 15 parts by mass or more and 80 parts by mass or less, preferably 20 parts by mass or more and 60 parts by mass or less, and titanium in an amount of 5 parts by mass or less, preferably 3 parts by mass or less, with respect to 100 parts by mass of the copper.

The above mass ratio of the components of the metal layer 50 is based on a value calculated by analyzing the metallized substrate 100 produced. In specific, the above mass ratio can be determined by: giving an etching treatment by an acid and the like to the metallized substrate 100 obtained after the firing; dissolving only the metal layer 50 (excluding the titanium nitride layer part); and analyzing the resultant solution.

If the silver content in the metal layer 50 is too small, the resistance of the metal layer 50 tends to increase. On the other hand, if the silver content is too large, material costs tend to increase, and also the metal layer tends to deform easily during firing. The latter tendency is seen to be due to decline in the melting point of the metal layer 50. If the silver content is increased within the above range, the advantageous effects of reducing voids in the metal layer 50 and lowering the resistance value of the metal layer 50 can be attained.

Not only does titanium raises the electrical resistance of the metal layer 50; but also according to the studies by the inventors, the titanium component segregated on the surface (the inventors assume that this titanium component is titanium oxide) causes tarnish and degradation of platability on the surface of the metal layer 50. Therefore, it is preferable that all the titanium (titanium hydride) be consumed in the titanium nitride forming reaction and do not remain in the metal layer 50 after the firing. Even with the method of the present invention, it is not easy to set the titanium content in the metal layer 50 at less than 0.5 parts by mass with respect to 100 parts by mass of the copper. Further, it is even more difficult to set the titanium content at less than 0.2 parts by mass. However, if the titanium content is 5 parts by mass or less, the above mentioned negative effects such as tarnish and degradation of the platability can be inhibited to a practically permissible range. Furthermore, if the titanium content is 3 parts by mass or less, there will not be any practical problems.

As mentioned above, in order to prevent tarnish on the surface of the metal layer and to attain favorable platability, it is important to lower the titanium concentration in the surface layer part of the metal layer 50. The titanium component has a characteristic that it easily diffuses and migrates to the surface of the metal layer during firing due to influence by oxygen and the like that are present in a tiny amount in the firing atmosphere. In the method of the present invention, since the titanium component is contained only in the first paste layer, the diffusion migration of this titanium component can be inhibited. Especially by performing the firing in the heat-resistant container under the non-oxidizing atmosphere, it is possible to reduce the titanium concentration on the surface of the metal layer 50 more effectively.

Such an effect can be evaluated by measuring the titanium concentration in the surface layer part of the metal layer 50. Specifically, it can be evaluated by the ratio (B/A) between the total mass concentration (A) of the copper and silver and the mass concentration (B) of the titanium, which ratio is obtained in measurement, with an accelerating voltage of an electron beam set at 10 kV, by energy dispersive X-ray spectroscopy suitable for the composition analysis of the surface layer part.

According to the examinations by the inventors, it is confirmed that when the above ratio (B/A) exceeds 0.2, the surface of the metal layer 50 is likely to tarnish and the adhesiveness of a plating layer to the metallized layer is likely to degrade. By contrast, according to the method of the present invention, the above ratio (B/A) can be made to be 0.01 or more and 0.2 or less, preferably 0.02 or more and 0.15 or less.

Even for a metallized substrate obtained by a conventional method, if the tarnished surface of the metal layer is given a treatment such as etching and polishing, it is not impossible to adjust the B/A value of the surface of the metal layer in the preferred range of the present application. However, since a titanium nitride layer is not formed well enough on such a substrate, the adhesion strength of the metal layer remains poor.

In contrast, by giving an etching or polishing treatment to the surface of the metal layer 50 of the metallized substrate 100 obtained (after firing) by the method of the present invention, it is possible to further improve the surface platability while maintaining high adhesiveness of the metal layer to the substrate.

The thickness of the metal layer 50 is preferably 3 μm or more and 200 μm or less, and more preferably 5 μm or more and 100 μm or less, in order to attain favorable electrical conductivity of the wiring pattern and also to easily form a fine wiring pattern.

(Adhesion Strength and Electrical Conductivity of the Metallized Substrate 100)

The metallized substrate 100 of the present invention comprises the titanium nitride layer 60 between the sintered nitride ceramic substrate 10 and the metal layer 50. Therefore, the adhesion strength of the metal layer 50 is thought to be high; and the metallized substrate 100 can have adhesion strength of preferably 50 N or more, more preferably 80 N or more, and still more preferably 90 N or more when evaluating the adhesion strength with a metal layer pattern in a 2 mm square (meaning a square with 2 mm on each side; the area of the square being 4 mm$^2$).

To measure the bonding strength of the wiring pattern, a nail head pin made of 42 alloy which has a tip diameter of φ1.1 mm and has the surface of the tip plated with nickel was used; the surface of the metal layer 50 of the metallized substrate 100 is plated with Ni/Au; the nail head pin is soldered to this plating film through Pb—Sn solder in a perpendicular manner; and this nail head pin is pulled in the perpendicular direction at a rate of 10 mm/min. The strength shown at a time when this nail head pin comes off is defined as the bonding strength.

Additionally, in the metallized substrate 100 of the present invention, by setting the titanium content in the metal layer 50 at a predetermined amount or less, containing silver in a predetermined amount, and reducing voids in the metal layer 50, the electrical conductivity of the metallized substrate 100 can be enhanced and the resistivity thereof measured by the four-terminal method can be $7.5 \times 10^{-8}$ Ω·m or less, more preferably $7.0 \times 10^{-8}$ Ω·m or less.

EXAMPLES

Example 1

Preparation of a Paste Composition 1

A mortar was used to pre-mix 15 parts by mass of copper powder having an average particle size of 0.3 μm, 82 parts by mass of copper powder having an average particle size of 2 µm, and 3 parts by mass of titanium hydride powder having an average particle size of 5 with a vehicle in which polyalkyl methacrylate was dissolved in terpineol; and thereafter a three-roll mill was used to subject the mixture to a dispersion treatment, thereby preparing a paste composition 1.

(Preparation of a Paste Composition 2)

A mortar was used to pre-mix Ag—Cu alloy powder (BAg-8; composition: 72 weight % of silver-28 weight % of copper) having an average particle size of 6 µm, with a vehicle in which polyalkyl methacrylate was dissolved in terpineol; and thereafter a three-roll mill was used to subject the mixture to a dispersion treatment, thereby preparing a paste composition 2.

(Production of a Metallized Substrate)

The above paste composition 1 prepared was printed, by screen printing, onto a sintered aluminum nitride substrate (trade name: SH-30, manufactured by Tokuyama Corporation) having a thickness of 0.64 mm; and was dried at 100° C. for 10 minutes to form a first paste layer (the thickness of the first paste layer was 15 µm). At this time, the mass of the first paste layer formed on the substrate was calculated from the changes in the mass of the substrate before and after forming the first paste layer. Next, the above paste composition 2 was printed on top of the first paste layer by screen printing, and dried at 100° C. for 10 minutes to form a second paste layer (the thickness of the second paste layer was 10 µm). At this time, the mass of the second paste layer formed on the substrate was calculated from the changes in the mass of the substrate before and after forming the second paste layer. The mass ratio between the first past layer and the second paste layer (the mass ratio in terms of the metal component only: second paste layer/first paste layer) was 0.68, excluding the mass of the polyalkyl methacrylate used as a binder. When the amount of the titanium hydride powder was calculated from this mass ratio between the first paste layer and the second paste layer, based on the total amount, as 100 parts by mass, of the copper powder and alloy powder in the first paste layer and second paste layer together, it was 1.8 parts by mass. Further, the mass ratio between the silver component and the copper component in the first paste layer and second paste layer together was 0.42 (silver component/copper component).

Subsequently, the workpiece was fired at 850° C. for 30 minutes in a vacuum (vacuum degree: $4 \times 10^{-3}$ Pa to $8 \times 10^{-3}$ Pa); thereby a metallized substrate was obtained. At this time, the substrate was fired in a state that it was accommodated into a setter (airtight container) made of aluminum nitride. The color tone of the metallized surface of the resultant metallized substrate was light orange. The thickness of the metallized layer (metal layer) was 20 Table 1 shows the compositions of the above paste composition 1 and paste composition 2. Table 2 shows: the mass ratio (the mass ratio in terms of the metal component only) between the above first paste layer and second paste layer; the thickness of each paste layer; the amount of the titanium hydride powder; the mass ratio between the silver component and the copper component; the firing temperature of the metallized substrate; and the firing time. The metallized substrate obtained was analyzed and evaluated in the following manner. The results are shown in Tables 2 and 3.

Examples 2 to 3

A metallized substrate was produced in the same manner as in Example 1, except that the material composition of the paste was as shown in Table 1; and was analyzed and evaluated in the following manner. The results are shown in Tables 2 and 3.

Example 4

Embodiment Shown in FIG. 2a (Preparation of Paste Compositions 1 and 2)

Paste compositions 1 and 2 were prepared in the same manner as in Example 1, except that the material compositions of the pastes were as shown in Table 1.

(Preparation of a Paste Composition 3)

A mortar was used to pre-mix 20 parts by mass of copper powder having an average particle size of 0.3 µm and 80 parts by mass of copper powder having an average particle size of 2 µm, with a vehicle in which polyalkyl methacrylate was dissolved in terpineol; and thereafter a three-roll mill was used to subject the mixture to a dispersion treatment, thereby preparing a paste composition 3.

(Production of a Metallized Substrate)

The above paste composition 1 prepared was printed, by screen printing, onto a sintered aluminum nitride substrate (trade name: SH-30, manufactured by Tokuyama Corporation) having a thickness of 0.64 mm; and then was dried at 100° C. for 10 minutes to form a first paste layer (the thickness of the first paste layer was 14 µm). At this time, the mass of the first paste layer formed on the substrate was calculated from the changes in the mass of the substrate before and after forming the first paste layer. Next, the above paste composition 3 was printed on top of the first paste layer by screen printing, and dried at 100° C. for 10 minutes to form a third paste layer (the thickness of the third paste layer was 11 µm). At this time, the mass of the third paste layer formed on the substrate was calculated from the changes in the mass of the substrate before and after forming the third paste layer. Subsequently, the above paste composition 2 was printed on top of the third paste layer by screen printing, and then dried at 100° C. for 10 minutes. Further, the paste composition 2 was again printed and dried to form a second paste layer (the thickness of the second paste layer was 21 µm). At this time, the mass of the second paste layer formed on the substrate was calculated from the changes in the mass of the substrate before and after forming the second paste layer. The mass ratio between the first past layer and the second paste layer (the mass ratio in terms of the metal component only: second paste layer/first paste layer) was 1.7, excluding the mass of the polyalkyl methacrylate used as a binder. In addition, the mass ratio between the first past layer and the third paste layer (the mass ratio in terms of the metal component only: third paste layer/first paste layer) was 0.92, excluding the mass of the polyalkyl methacrylate used as a binder. When the amount of the titanium hydride powder was calculated from this mass ratio (in terms of the metal component only) between the first paste layer and the second paste layer and the mass ratio (in terms of the metal component only) between the first paste layer and the third paste layer, based on the total amount, as 100 parts by mass, of the copper powder and alloy powder in the entire paste layer altogether, it was 2.3 parts by mass. Further, the mass ratio between the silver component and the copper component (silver component/copper component) in the entire paste layer altogether was 0.53. Thereafter, the workpiece was fired in the same manner as in Example 1, and a metallized substrate was obtained. The resultant metallized substrate was analyzed and evaluated in the following way.

Example 5

Embodiment Shown in FIG. 2b (Production of Metallized Substrate)

The above paste composition 1 prepared in Example 4 was printed, by screen printing, onto a sintered aluminum nitride substrate (trade name: SH-30, manufactured by Tokuyama Corporation) having a thickness of 0.64 mm; and then was dried at 100° C. for 10 minutes to form a first paste layer (the thickness of the first paste layer was 14 µm). At this time, the mass of the first paste layer formed on the substrate was calculated from the changes in the mass of the substrate before and after forming the first paste layer. Next, the paste composition 2 prepared in Example 4 was printed on top of the first paste layer by screen printing and dried at 100° C. for 10 minutes. Further, the paste composition 2 was again printed and dried to form a second paste layer (the thickness of the second paste layer was 21 µm). At this time, the mass of the second paste layer formed on the substrate was calculated from the changes in the mass of the substrate before and after forming the second paste layer. Subsequently, the paste composition 3 prepared in Example 4 was printed on top of the second paste layer by screen printing, and dried at 100° C. for 10 minutes to form a third paste layer (the thickness of the third paste layer was 11 µm). At this time, the mass of the third paste layer formed on the substrate was calculated from the changes in the mass of the substrate before and after forming the third paste layer. The mass ratio between the first past layer and the second paste layer (the mass ratio in terms of the metal component only: second paste layer/first paste layer) was 1.7, excluding the mass of the polyalkyl methacrylate used as a binder. In addition, the mass ratio between the first past layer and the third paste layer (the mass ratio in terms of the metal component only: third paste layer/first paste layer) was 0.90, excluding the mass of the polyalkyl methacrylate used as a binder. When the amount of the titanium hydride powder was calculated from the above mass ratio (in terms of the metal component only) between the first paste layer and the second paste layer and the above mass ratio (in terms of the metal component only) between the first paste layer and the third paste layer, based on the total amount, as 100 parts by mass, of the copper powder and alloy powder in the entire paste layer altogether, it was 2.3 parts by mass. Further, the mass ratio between the silver component and the copper component in the entire paste layer altogether was 0.53 (silver component/copper component). Thereafter, the workpiece was fired in the same manner as in Example 1; and a metallized substrate was obtained. The resultant metallized substrate was analyzed and evaluated in the following way.

Comparative Examples 1 to 4

A metallized substrate was produced in the same manner as in Example 1, except that the material composition of the paste was as shown in Table 1; and was analyzed and evaluated in the following way. However, in Comparative Examples 1, 3, and 4, the second paste layer was not formed. The results are shown in Tables 2 and 3.

<Analysis of the Metallized Layer (Metal Layer)>

(Analysis of the Composition of the Metal Layer)

The metallized substrate was immersed into a 50% nitric acid aqueous solution to dissolve the metal layer. The resultant solution and black deposits were all collected. At this time, there remained a gold-colored titanium nitride layer on the substrate from which the metal layer was removed. Hydrofluoric acid and hydrogen peroxide were further added to the collected solution to dissolve the black deposits entirely. Thereafter, the copper, silver and titanium components in the solution were quantitatively analyzed by inductively coupled plasma (ICP) optical emission spectrometry. The analysis results obtained are shown in Table 2 (the contents per 100 parts by mass of Cu).

(Analysis of the Titanium Amount on the Surface of the Metal Layer)

The surface of the metal layer was analyzed by a scanning electron microscope (S-3400N, manufactured by Hitachi High-Technologies Corp.) equipped with an energy dispersive X-ray analyzer (INCA Energy 350, manufactured by Oxford Instruments Co.). At the time of the analysis, the electron accelerating voltage was set at 10 kV; and the ratio (B/A) of the mass concentration (B) of the titanium to the total mass concentration (A) of the copper and silver was calculated from the mass concentrations of the detected elements. The results are shown in Table 2.

(Checking if a Titanium Nitride Layer was Formed)

The metallized substrate was embedded into a resin and polished to produce a sample for observation of a cross section of the metallized substrate. The resultant sample was observed through the scanning electron microscope to check the thickness of the titanium nitride layer at the interface between the substrate and the metallized layer. The results are shown in Table 3.

<Evaluation of the Metallized Substrate>

(Evaluation of the Amount of Voids in the Metal Layer)

The sample obtained above of the cross section of the metallized substrate was observed through the scanning electron microscope (with 2000 magnification, evaluating a range of $4 \times 10^{-3}$ mm$^2$ for the area of the metal layer), to evaluate the amount of voids in the metal layer. When the area ratio of the voids to the cross section of the metal layer was less than 1%, the case was judged to be good (O); when it was 1% or more and less than 5%, the case was judged to be acceptable (Δ); and when it was 5% or more, the case was judged to be bad (X). The results are shown in Table 3.

(Evaluation of Craters on the Surface of the Metal Layer)

The surface of the metal layer of the metallized substrate was observed through a laser scanning microscope to evaluate the frequency at which crater-form defects (hereinafter also simply referred to as the craters) are generated on the surface of the metal layer. Defining a diameter of a minimum circle containing a crater thereinside as the size of the crater, the size of the crater, and the number of craters generated were calculated. When the number of craters having a size of 10 µm or more was less than 5 per square millimeter, the case was judged to be good (O); when it was 5 or more and less than 20, the case was judged to be acceptable (Δ); and when it was 20 or more, the case was judged to be bad (X). The results are shown in Table 3.

(Evaluation of the Forced-Out Quantity of the End Portion of the Metal Layer)

With the boundary position between the substrate and the paste layer pattern printed and dried as a reference, the forced-out quantity of the metallized component that was forced out from the end portion of the metal layer after the firing, was evaluated based on the following criterion: when the forced-out quantity was less than 15 µm, the case was judged to be good (O); when it was 15 µm or more and less than 50 µm, the case was judged to be acceptable (Δ); and when it was 50 µm or more, the case was judged to be bad (x). The results are shown in Table 3.

(Evaluation of the Volume Resistivity of the Metallized Pattern)

The volume resistivity of the metal layer pattern formed on the metallized substrate was measured by the four-terminal method. The results are shown in Table 3.

(Evaluation of the Bonding Strength)

The metallized substrate obtained was subjected to nickel electroless plating of about 2.5 μm, followed by gold electroless plating of about 0.4 μm; and then a bonding test of the metal layer was conducted. A nail head pin made of 42 alloy having a tip diameter of φ1.1 mm and having the surface of the tip plated with nickel was soldered onto a 2-mm square metal layer pattern with Pb—Sn solder in a manner perpendicular to the substrate. This nail head pin was pulled in the perpendicular direction at a rate of 10 mm/min; and the load shown at a time when breaking from the substrate occurred was recorded. The same test was conducted 5 times to calculate the average value of the loads. The results are shown in Table 3. In addition, the breaking mode at the time of the breaking was checked. The results are shown in Table 3.

TABLE 1

|  | Paste composition 1 (part by mass) | | | | | Paste composition 2 (part by mass) | | | | Paste composition 3 (part by mass) | |
| --- | --- | --- | --- | --- | --- | --- | --- | --- | --- | --- | --- |
|  | Cu 0.3 μm | Cu 2 μm | Ag 0.6 μm | Ag—Cu 6 μm | TiH$_2$ 5 μm | Cu 0.3 μm | Cu 2 μm | Ag 0.6 μm | Ag—Cu 6 μm | Cu 0.3 μm | Cu 2 μm |
| Example 1 | 15 | 82 | — | — | 3 | — | — | — | 100 | | |
| Example 2 | 15 | 80 | — | — | 5 | — | — | — | 100 | | |
| Example 3 | 11 | 57 | 27 | — | 5 | 40 | — | — | 60 | | |
| Example 4 | 18 | 74 | — | — | 8 | — | — | — | 100 | 20 | 80 |
| Example 5 | 18 | 74 | — | — | 8 | — | — | — | 100 | 20 | 80 |
| Comparative Example 1 | 15 | 80 | — | — | 5 | | | | | | |
| Comparative Example 2 | 20 | 80 | — | — | — | — | — | — | 100 | | |
| Comparative Example 3 | 15 | 40 | — | 40 | 5 | | | | | | |
| Comparative Example 4 | — | — | — | 90 | 10 | | | | | | |

TABLE 2

| | Thickness of paste layer (μm) | Mass ratio (second paste layer/ first paste layer) | Mass ratio (third paste layer/ first paste layer) | Amount of titanium hydride powder (part by mass) with respect to 100 parts by mass of copper component and silver component | Mass ratio (silver component/ copper component) | Firing conditions | | | Content (part by mass) per 100 parts by mass of Cu in metal layer | | Titanium concentration in surface layer part of metal layer |
| --- | --- | --- | --- | --- | --- | --- | --- | --- | --- | --- | --- |
| | | | | | | Temperature (° C.) | Time (min) | Atmosphere | Ag | Ti | |
| Example 1 | First paste layer: 15 Second paste layer: 10 | 0.68 | | 1.8 | 0.42 | 850 | 30 | Vacuum | 41 | 0.7 | 0.08 |
| Example 2 | First paste layer: 15 Second paste layer: 10 | 0.72 | | 3 | 0.45 | 850 | 30 | Vacuum | 43 | 1.2 | 0.09 |
| Example 3 | First paste layer: 14 Second paste layer: 12 | 0.99 | | 2.6 | 0.56 | 850 | 30 | Vacuum | 55 | 1.1 | 0.06 |
| Example 4 | First paste layer: 14 Third paste layer: 11 Second paste layer: 21 | 1.7 | 0.92 | 2.3 | 0.53 | 850 | 30 | Vacuum | 53 | 0.9 | 0.12 |
| Example 5 | First paste layer: 14 Third paste layer: 11 Second paste layer: 21 | 1.7 | 0.9 | 2.3 | 0.53 | 850 | 30 | Vacuum | 52 | 0.9 | 0.1 |
| Comparative Example 1 | First paste layer: 15 | | | 5.3 | 0 | 850 | 30 | Vacuum | 0 | 5 | 0.14 |
| Comparative Example 2 | First paste layer: 15 Second paste layer: 11 | 0.71 | | 0 | 0.43 | 850 | 30 | Vacuum | 42 | 0 | 0 |
| Comparative Example 3 | First paste layer: 15 | | | 5.3 | 0.44 | 850 | 30 | Vacuum | 42 | 1.3 | 0.1 |
| Comparative Example 4 | First paste layer: 15 | | | 11.1 | 2.57 | 850 | 30 | Vacuum | 259 | 18 | 0.11 |

TABLE 3

| | Thickness of TiN layer (μm) | Voids in metal layer | Whether crater is formed | Forced-Out from pattern | Volume resistivity (W·m) | Bonding strength (N) | Breaking mode |
|---|---|---|---|---|---|---|---|
| Example 1 | 0.4 | ○ | ○ | ○ | $3.2 \times 10^{-8}$ | 112 | Pin breaking or within-solder breaking |
| Example 2 | 0.6 | ○ | ○ | ○ | $4.3 \times 10^{-8}$ | 114 | Pin breaking or within-solder breaking |
| Example 3 | 0.5 | ○ | ○ | ○ | $3.7 \times 10^{-8}$ | 110 | Pin breaking or within-solder breaking |
| Example 4 | 0.4 | ○ | ○ | ○ | $4.1 \times 10^{-8}$ | 111 | Pin breaking or within-solder breaking |
| Example 5 | 0.4 | ○ | ○ | ○ | $4.0 \times 10^{-8}$ | 108 | Pin breaking or within-solder breaking |
| Comparative Example 1 | 0 | X | ○ | ○ | $2.5 \times 10^{-7}$ | | Breaking-off between substrate and metallayer |
| Comparative Example 2 | 0 | ○ | ○ | ○ | $2.6 \times 10^{-8}$ | | Breaking-off between substrate and metallayer |
| Comparative Example 3 | 0.7 | X | X | ○ | $6.6 \times 10^{-8}$ | 106 | Pin breaking or within-solder breaking |
| Comparative Example 4 | 0.9 | ○ | ○ | X | $9.1 \times 10^{-8}$ | 113 | Pin breaking or within-solder breaking |

In the production method of Comparative Example 1, an Ag component was not contained in the paste composition, and a liquid phase was not produced at the time of firing; therefore, the sintering was poorly carried out, and a titanium nitride layer was hardly formed. Consequently, the bonding strength of the metallized substrate was very small; and in performing nickel electroless plating on the metallized substrate, the metallized layer came off in the pretreatment for plating. Therefore, the bonding strength test could not be carried out.

In the production method of Comparative Example 2, titanium hydride powder was not contained in the paste composition; therefore a titanium nitride layer was not formed in the resultant metallized substrate. Consequently, the bonding strength of the metallized substrate was very small; and in performing nickel electroless plating on the metallized substrate, the metallized layer came off in the pretreatment for plating. Therefore, the bonding strength test could not be carried out.

In the production method of Comparative Example 3, a second paste layer containing Ag—Cu alloy powder was not formed on the first paste layer, but instead, Ag—Cu alloy powder was added to the first paste layer. As a consequence, a number of voids that were generated when Ag—Cu alloy powder melted at the time firing were left unfilled and remained in the metal layer. Therefore, craters appeared on the surface of the metal layer and voids were seen in the metal layer.

In the production method of Comparative Example 4, Ag—Cu alloy powder was used as the paste composition; and the silver content in the metal layer of the resultant metallized substrate was extremely large. As a result, the forced-out quantity from the metallized pattern was large.

Example 6

Preparation of a Paste Composition 1

To a vehicle in which 1.2 parts by mass of an acrylic resin (polyalkyl methacrylate), 1.9 parts by mass of ethylcellulose (grade: 7 cps), and 0.3 parts by mass of a dispersant were dissolved in terpineol, 40.7 parts by mass of copper powder having an average particle size of 0.3 μm, 59.3 parts by mass of copper powder having an average particle size of 2 μm, 40.7 parts by mass of silver powder having an average particle size of 0.6 μm, and 7.4 parts by mass of titanium hydride powder having an average particle size of 5 μm were added; a mortar was used to pre-mixed them; and thereafter a three-roll mill was used to subject the mixture to a dispersion treatment, thereby preparing a paste composition 1. The viscosity (Pa·s) at 25° C. of the prepared paste composition 1 when changing the rotation speed of the rotor was measured by the method of JIS Z3284 Annex 6 using a spiral-type viscometer (PCU-2-1, manufactured by Malcom Co., Ltd.); and the thixotropic index (TI) was calculated. The results are shown in Table 4.

Preparation of a Paste Composition 2

To a vehicle in which 4 parts by mass of polyalkyl methacrylate and 0.2 parts by mass of a dispersant were dissolved in terpineol, 50 parts by mass of Ag—Cu alloy powder (BAg-8; composition: 72 weight % of silver-28 weight % of copper) having an average particle size of 6 μm, 35 parts by mass of copper powder having an average particle size of 0.3 μm, and 15 parts by mass of copper powder having an average particle size of 2 μm were added; a mortar was used to pre-mix them; and thereafter a three-roll mill was used to subject the mixture to a dispersion treatment, thereby preparing a paste composition 2.

(Production of a Metallized Substrate)

The paste composition 1 prepared above was screen printed onto a sintered aluminum nitride substrate (trade name: SH-30, manufactured by Tokuyama Corporation) having a thickness of 0.64 mm, by using a screen printing plate (325 mesh; an emulsion thickness of 7 μm) having a cross-shaped pattern of 80 μm in line width and 320 μm in length; and then was dried at 100° C. for 10 minutes to form a first paste layer. Next, the paste composition 2 prepared above was screen printed onto the first paste layer, by using a screen printing plate (325 mesh; an emulsion thickness of 7 μm) having a cross-shaped pattern of 40 μm in line width and 280 μm in length; and then was dried at 100° C. for 10 minutes to form a second paste layer. At this time, the printing was carried out by adjusting the positions thereof such that the center of the cross-shaped pattern of the first paste layer and the center of the cross-shaped pattern of the second paste layer overlap with each other, in order to prevent the paste composition 2 from overflowing beyond the first paste layer and from being printed onto the sintered aluminum nitride substrate. Subsequently, the workpiece was fired at 850° C. for 30 minutes in a vacuum (vacuum degree: $4 \times 10^{-3}$ Pa to $8 \times 10^{-3}$ Pa); thereby a metallized substrate was obtained. In addition to this, a screen printing plate (325 mesh; an emulsion thickness of 7 μm) having a 10 mm square pattern was used to produced a metallized substrate in a similar manner.

(Evaluation of the Shape of the Metal Layer Pattern)

Figure 4:
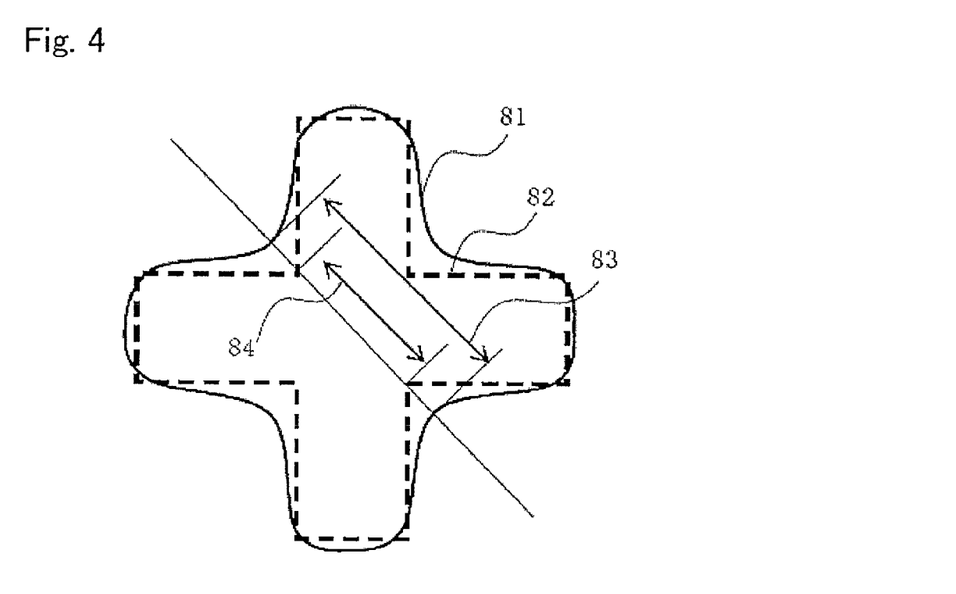
FIG. 4 is a view illustrating an evaluation method of pattern precision in a case of producing a metallized substrate which has a pattern of a metal layer in a cross shape.

As shown in FIG. 4, the surface of the metallized substrate on which a cross-shaped metal layer 81 was formed was observed through a laser microscope; and a distance 83 of a line segment that joins the opposing vertices of the re-entrant angles of the cross shape 81 was measured. When the vertices were unclear, the line segment with the shortest distance was measured. The difference (μm) between the distance 83 thus measured and a distance 84 of a line segment that joins the opposing vertices of the re-entrant angles of the cross shape 82 on the screen mask was calculated to determine the amount of bleeding of the pattern. The results are shown in Table 4.

(Evaluation of the Smoothness of the Surface of the Metal Layer)

The surface of the metal layer of the metallized substrate having the 10-mm square metal layer pattern obtained above, was measured by using a surface roughness meter (SURF-COM 554A manufactured by Tokyo Seimitsu Co., Ltd.) to determine arithmetic average surface roughness (Ra) (μm). The results are shown in Table 4.

Examples 7 to 11

A metallized substrate was produced in the same manner as in Example 6, except that the material composition of the paste composition 1 was as shown in Table 4; and the evaluation thereof was conducted. The results are shown in Table 4.

In Examples 9 to 11, with the increase in the content of the copper powder having an average particle size of 0.3 μm, the thixotropic index became higher, and accordingly the amount of bleeding of the pattern decreased.

In Examples 6 to 8, ethylcellulose and acrylic were contained as the binder. Thus, compared with Example 9, in which only acrylic was contained, even though the content of the copper powder having an average particle size of 0.3 μm was the same, the thixotripic index was higher, and accordingly the amount of bleeding of the pattern was smaller. In addition, the arithmetic average roughness (Ra) was approximately the same irrespective of the thixotropic index. This is thought to be the result of the effects of making the surface smooth by carrying out the firing with the second paste layer formed.

INDUSTRIAL APPLICABILITY

The metallized substrate 100 produced by the method of the present invention can be favorably used for mounting a semiconductor device.

DESCRIPTION OF THE REFERENCE NUMERALS 10 sintered nitride ceramic substrate
20 first paste layer
30 second paste layer
40 third paste layer
50 metal layer
60 titanium nitride layer
100 metallized substrate
110 second layered body
72 lower paste layer
74 upper paste layer
76 sintered body
81 metal layer pattern of metallized substrate
82 pattern of screen printing plate
83 distance of line segment that joins opposing vertices of re-entrant angles of cross shape on the metal layer pattern
84 distance of line segment that joins opposing vertices of re-entrant angles of cross shape on the screen mask
X overflowing of paste
Y rising of metal layer

The invention claimed is:

1. A production method of a metallized substrate comprising a wiring pattern, the metallized substrate comprising: a sintered nitride ceramic substrate; a titanium nitride layer formed on the sintered substrate; and a metal layer being the wiring pattern and containing copper, silver and titanium formed on the titanium nitride layer, the method comprising:
a step of layering a first paste layer by means of a first paste composition containing copper powder and titanium

TABLE 4

| | Paste composition 1 (part by mass) | | | | | | Ratio of | | | Amount of bleeding | |
|---|---|---|---|---|---|---|---|---|---|---|---|
| | Cu 0.3 μm | Cu 2 μm | Ag 0.6 μm | TiH$_2$ 5 μm | Acrylic resin | Ethylcellulose | Ethylcellulose/ Acrylic resin | Viscosity (25° C., 10 rpm) | TI | of pattern | Ra |
| Example 6 | 40.7 | 59.3 | 40.7 | 7.4 | 1.2 | 1.9 | 1.6 | 476 | 0.64 | 27 | 0.4 |
| Example 7 | 40.7 | 59.3 | 40.7 | 7.4 | 4.7 | 0.4 | 0.09 | 386 | 0.68 | 30 | 0.5 |
| Example 8 | 40.7 | 59.3 | 40.7 | 7.4 | 2.4 | 1.5 | 0.6 | 83 | 0.96 | 24 | 0.5 |
| Example 9 | 40.7 | 59.3 | 40.7 | 7.4 | 5.9 | 0 | 0 | 264 | 0.24 | 42 | 0.4 |
| Example 10 | 100 | 0 | 40.7 | 7.4 | 5.9 | 0 | 0 | 205 | 0.5 | 34 | 0.5 |
| Example 11 | 16.3 | 83.7 | 40.7 | 7.4 | 5.9 | 0 | 0 | 203 | 0.11 | 77 | 0.4 | hydride powder and having a thixotropic index of 0.2 to 1.0 on a part of the sintered nitride ceramic substrate, to produce a first layered body, wherein the part of the sintered nitride ceramic substrate is a part where the wiring pattern is to be formed, and wherein the copper powder is a mixed powder of copper powder A having an average particle size of 0.1 μm or more and less than 1.0 μm and copper powder B having an average particle size of 1.0 to 5.0 μm;

a step of layering a second paste layer by means of a second paste composition containing silver-copper alloy powder and not containing a titanium component on the first paste layer of the first layered body, to produce a second layered body, wherein the silver-copper alloy powder has a melting point of 630 to 850° C. and an average particle size of 0.1 to 20 μm; and a step of firing the second layered body, at a temperature such that the second paste composition melts wherein the temperature is not greater than melting point of copper and wherein the firing is carried out under a condition such that a shape of the first paste layer is maintained, to thereby form the titanium nitride layer and the metal layer on the sintered nitride ceramic substrate.

2. The production method of a metallized substrate according to claim 1, wherein the first paste layer further contains silver powder and/or silver-copper alloy powder, and contains the silver powder and/or the silver-copper alloy powder in an amount of 1 part by mass or more and 80 parts by mass or less, with respect to 100 parts by mass of the copper powder.

3. The production method of a metallized substrate according to claim 1, wherein the second paste layer further contains copper powder, and contains the copper powder in an amount of 1 part by mass or more and 300 parts by mass or less, with respect to 100 parts by mass of the silver-copper alloy powder.

4. The production method of a metallized substrate according to claim 1, wherein the content of the titanium hydride powder in the first paste layer is 1 part by mass or more and 10 parts by mass or less, based on the total mass of the copper component and the silver component in the first paste layer and the second paste layer together as 100 parts by mass.

5. The production method of a metallized substrate according claim 1, wherein the mass ratio (silver component/copper component) of the silver component to the copper component in terms of the silver component and the copper component in the first paste layer and the second paste layer together is 0.15 or more and 0.8 or less.

6. The production method of a metallized substrate according to claim 1, wherein the step of firing the layered body is a step of firing the layered body in a heat-resistant container under a non-oxidizing atmosphere.

7. The production method of a metallized substrate according to claim 1, wherein the silver-copper alloy powder in the second paste layer contains copper in an amount of 20 to 35 mass %.

8. The production method of a metallized substrate according to claim 1, wherein the silver-copper alloy powder in the second paste layer has a eutectic composition of silver-copper.

9. The production method of a metallized substrate according to claim 1,
wherein the first paste layer is formed by printing the first paste composition;
the first paste composition comprises: 100 parts by mass of the copper powder; 1 to 10 parts by mass of the titanium hydride powder having an average particle size of 0.1 to 20 μm; and 1 to 10 parts by mass of a binder resin; and
the copper powder in the first paste composition is the mixed powder containing the copper powder A in an amount of 30 parts by mass or more and less than 100 parts by mass, and the copper powder B as a remainder.

10. The production method of a metallized substrate according to claim 9, wherein the first paste composition comprises, as the binder resin:
0.2 to 3.0 parts by mass of an ethylcellulose resin; and
0.5 to 8.0 parts by mass of an acrylic resin.

11. A production method of a metallized substrate comprising a wiring pattern, the metallized substrate comprising: a sintered nitride ceramic substrate; a titanium nitride layer formed on the sintered substrate; and a metal layer being the wiring pattern and containing copper, silver, and titanium formed on the titanium nitride layer, the method comprising:

a step of layering a first paste layer by means of a first paste composition containing copper powder and titanium hydride powder and having a thixotropic index of 0.2 to 1.0 on a part of the sintered nitride ceramic substrate, to produce a first layered body, wherein the part of the sintered nitride ceramic substrate is a part where the wiring pattern is to be formed, and wherein the copper powder is a mixed powder of copper powder A having an average particle size of 0.1 μm or more and less than 1.0 μm and copper powder B having an average particle size of 1.0 to 5.0 μm;

a step of layering a second paste layer by means of a second paste composition containing silver-copper alloy powder and not containing a titanium component on the first paste layer of the first layered body, to produce a layered body, wherein the silver-copper alloy powder has a melting point of 630 to 850° C. and an average particle size of 0.1 to 20 μm;

a step of layering a third paste layer containing copper powder between the first paste layer and the second paste layer, or on the second paste layer, to produce a layered body; and a step of firing the layered body obtained through these steps, at a temperature such that the second paste composition melts wherein the temperature is not greater than melting point of copper and wherein the firing is carried out under a condition such that a shape of the first paste layer is maintained, to thereby form the titanium nitride layer and the metal layer on the sintered nitride ceramic substrate.

12. The production method of a metallized substrate according to claim 11, wherein the content of the titanium hydride powder in the first paste layer is 1 part by mass or more and 10 parts by mass or less, based on the total mass of the copper component and the silver component in the first paste layer, the second paste layer, and the third paste layer altogether as 100 parts by mass.

13. The production method of a metallized substrate according to claim 11, wherein the step of firing the layered body is a step of firing the layered body in a container under a non-oxidizing atmosphere.

14. The production method of a metallized substrate according to claim 11, wherein the third paste layer does not contain a titanium component.

15. The production method of a metallized substrate according to claim 11, wherein the silver-copper alloy powder in the second paste layer contains copper in an amount of 20 to 35 mass %.

16. The production method of a metallized substrate according to claim 11, wherein the silver-copper alloy powder in the second paste layer has a eutectic composition of silver-copper.

17. The production method of a metallized substrate according to claim 11,
- wherein the first paste layer is formed by printing the first paste composition;
- the first paste composition comprises: 100 parts by mass of the copper powder; 1 to 10 parts by mass of the titanium hydride powder having an average particle size of 0.1 to 20 μm; and 1 to 10 parts by mass of a binder resin;
- the copper powder in the first paste composition is the mixed powder containing the copper powder A in an amount of 30 parts by mass or more and less than 100 parts by mass, and the copper powder B as a remainder.

18. The production method of a metallized substrate according to claim 17, wherein the first paste composition comprises, as the binder resin:
- 0.2 to 3.0 parts by mass of an ethylcellulose resin; and
- 0.5 to 8.0 parts by mass of an acrylic resin.

\* \* \* \* \*